(12) United States Patent
Bolda

(10) Patent No.: US 6,177,875 B1
(45) Date of Patent: Jan. 23, 2001

(54) SIMPLE VOLTAGE WINDOW SENSING CIRCUIT

(75) Inventor: Daniel J. Bolda, New Berlin, WI (US)

(73) Assignee: Rockwell Technologies, LLC, Thousand Oaks, CA (US)

( * ) Notice: Under 35 U.S.C. 154(b), the term of this patent shall be extended for 0 days.

(21) Appl. No.: 09/407,468

(22) Filed: Sep. 28, 1999

(51) Int. Cl.⁷ .................................................. G08B 21/00
(52) U.S. Cl. ............................ 340/660; 324/522; 361/18
(58) Field of Search ................................... 340/660, 661, 340/662, 663; 361/18, 86; 324/522, 526

(56) References Cited

U.S. PATENT DOCUMENTS

| 4,819,116 | * | 4/1989 | Piteo ........................................ 361/18 |
| 4,999,730 | * | 3/1991 | Pickard .................................... 361/59 |
| 5,418,834 | * | 5/1995 | Byatt et al. ............................. 379/26 |
| 5,440,234 | * | 8/1995 | Kondo .................................... 324/526 |
| 5,604,785 | * | 2/1997 | Pryor et al. ............................. 379/2 |
| 5,903,140 | * | 5/1999 | Acatrinei .............................. 323/299 |
| 5,978,235 | * | 11/1999 | Lampinen ............................. 363/21 |

* cited by examiner

Primary Examiner—Edward Lefkowitz
(74) Attorney, Agent, or Firm—Michael A. Jaskolski; John J. Horn; William R. Walbrun

(57) ABSTRACT

A simple voltage window sensing circuit including a current indicator, two Zener diodes and two digital transistors wherein the diode breakdown voltages are selected such that they define the upper and lower voltage limits of a voltage window, each diode causing a corresponding transistor to conduct when the breakdown voltage is exceeded, the indicator in series with a first transistor which is controlled by the diode which defines the lower limit and the transistors in parallel such that the first transistor only conducts when a voltage is within the window and hence the indicator only indicates when the voltage is within the window.

17 Claims, 3 Drawing Sheets

SIMPLE VOLTAGE WINDOW SENSING CIRCUIT

CROSS-REFERENCE TO RELATED APPLICATIONS

Not applicable.

STATEMENT REGARDING FEDERALLY SPONSORED RESEARCH OR DEVELOPMENT

Not applicable.

MICROFICHE APPENDIX

Not applicable.

BACKGROUND OF THE INVENTION

The present invention relates to voltage sensing circuitry, and more particularly to threshold window circuits which determine whether a measured voltage lies within a given voltage range.

Window comparator circuits have long been used in various electronic industries to determine whether a measured parameter is within a window bound by upper or lower limits. One particularly useful application for window sensing is in voltage sensing circuits which determine if a voltage between two nodes is within a window. Typical circuits of this type generate a signal when a measured voltage is within the window.

One well-known voltage window sensing circuit includes, among other circuitry, two comparators, two voltage dividers (e.g., four resistors) and an output pull-up resistor. Unfortunately, while being sufficiently accurate, a large parts count renders these types of comparators relatively expensive and requires significant printed circuit board space. For these reasons, when costs and circuit board space need to be minimized, comparators of this well-known type are unsatisfactory.

As is evident from the foregoing, a need exists for a cost-effective, space-minimizing voltage-window sensing circuit capable of preserving the functionality of the common window comparator circuit at a relatively low cost and which requires minimal circuit board space.

BRIEF SUMMARY OF THE INVENTION

It has been recognized that a simple arrangement including two Zener diodes, two "digital" transistors (two bipolar junction transistors, each transistor having resistors situated across its base-emitter junction and in series with its base) and a current sensor can be constructed which has a small parts count, is extremely inexpensive, is extremely reliable, and requires relatively little circuit board space. To this end, one inventive embodiment comprises first and second Zener diodes which are chosen such that their first and second breakdown voltages, respectively, essentially define the lower and upper limits of a voltage window needed in a given application.

The Zener diode cathodes are linked to a first node and the first and second Zener diode anodes are linked to first and second bases of the first and second transistors, respectively. Negligible amounts of current flow into these bases until the respective Zener diode voltages are exceeded. The collector of the second transistor is linked to the first node and its emitter is linked to the second node. The indicator is linked in series with the first transistor between the first and second nodes. When either transistor conducts, current passes from the first node to the second node. The current sensor may be any sensing element, such as a light emitting diode, an opto-coupled or magnetically-coupled circuit, an LED, etc.

When so constructed the circuit defines three voltage ranges between the first and second nodes, a first range below the lower voltage window limit, a second range within the window and a third range above the upper voltage window limit. To this end, when voltage between the first and second nodes is below the lower window limit (i.e., in the first range), neither Zener diode conducts, corresponding transistors are off and hence no current is sensed by the current sensor.

When the voltage between the first and second nodes exceeds the lower window limit but not the upper window limit, the first Zener diode breaks down causing the first transistor to conduct. Current passing through the first transistor is sensed by the sensor which indicates a voltage within the voltage window.

When the voltage between the first and second nodes exceeds the upper window limit both the first and second Zener diodes break down and corresponding transistors conduct. Assuming the current sensor has some resistance, all current passes through the second transistor and not the first such that the current sensor will not sense a current and will not indicate a voltage within the window.

Thus, one object is to determine if a voltage between the two nodes is within a voltage window. Another object is to achieve the aforementioned object inexpensively. This is accomplished by configuring a circuit with a reduced parts count.

Yet another object is to achieve the aforementioned objects while requiring only minimal circuit board space. This object also is accomplished by configuring a circuit with a reduced parts count.

In a preferred embodiment of the invention a resistor can be linked in series with the first transistor between the first and second nodes to ensure that no current passes through the first transistor when the voltage between the first and second nodes is above the upper voltage window limit.

In yet another embodiment of the present invention, a second resistor can be linked between the second collector and the first node such that the node between the second collector and second resistor becomes a voltage dividing node and wherein the first resistor is then linked between this dividing node and the first collector. Preferably the second resistor resistance is much greater than the first resistor's resistance (e.g., 10 to 1000 times the first resistor resistance). In fact, in at least one embodiment, the second resistor may be altogether removed.

The foregoing and other objects, advantages, and aspects of the present invention will become apparent from the following description. In the description, reference is made to the accompanying drawings which form a part hereof, and in which there is shown, by way of illustration, a preferred embodiment of the present invention. Such embodiment does not necessarily represent the full scope of the invention, however, and reference must also be made to the claims herein for properly interpreting the scope of this invention.

DETAILED DESCRIPTION OF THE INVENTION

Figure 1:
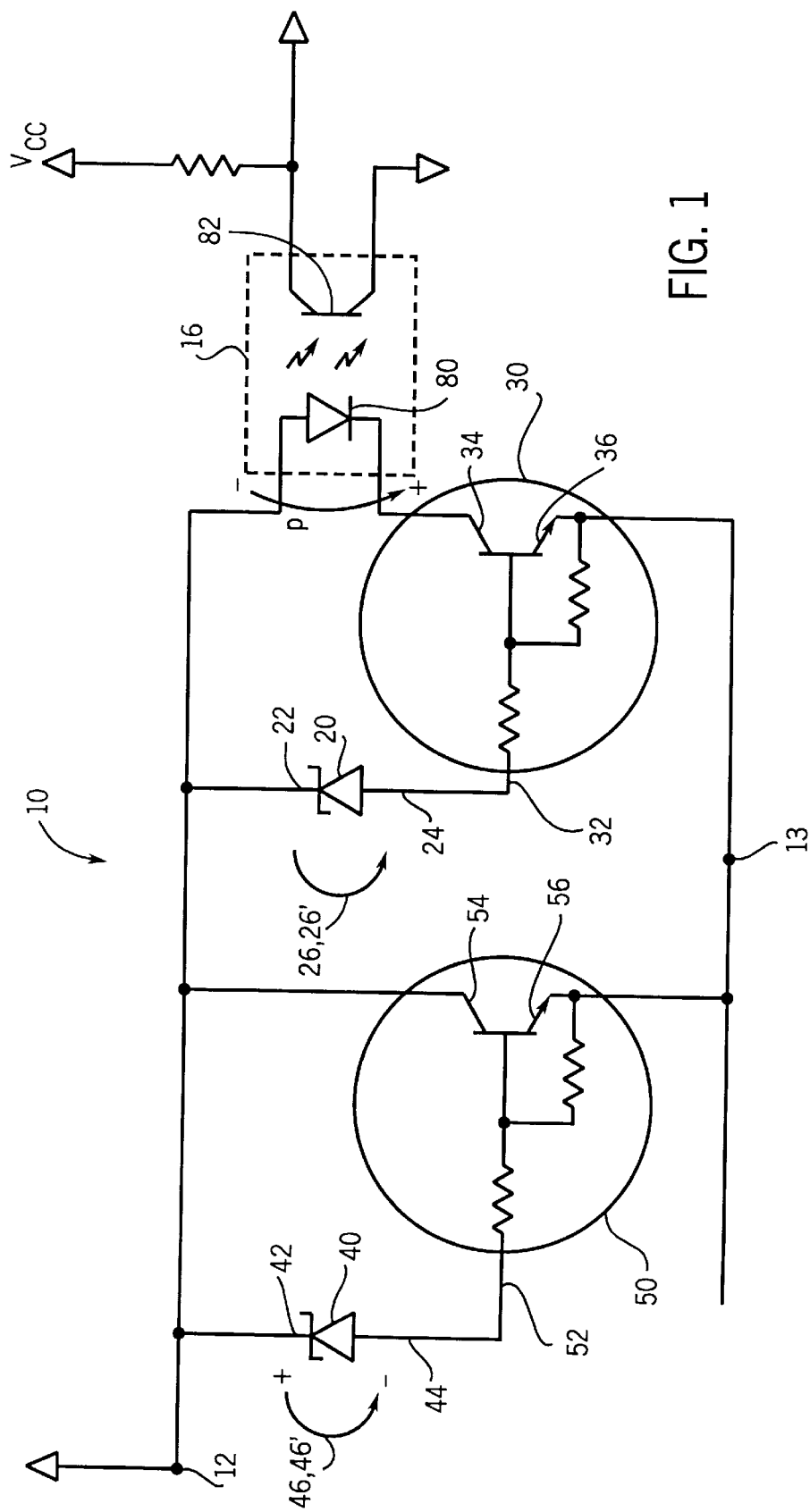
FIG. 1 is a schematic circuit diagram in accordance with one embodiment of the present invention.

Referring now to FIG. 1, a voltage window sensing circuit 10 can be used to indicate a voltage across a first node 12 and a second node 13. Circuit 10 includes a current indicator 16, a first Zener diode 20 having a first cathode 22 and a first anode 24 and characterized by a first breakdown voltage 26, a second Zener diode 40 having a second cathode 42 and a second anode 44 and characterized by a second breakdown voltage 46, a first bipolar junction digital transistor 30 having a first base 32, a first collector 34, and a first emitter 36 and a second bipolar junction transistor 50 having a second base 52, a second collector 54, and a second emitter 56.

Indicator 16 includes a light emitting diode 80 which is opti-coupled to a light sensitive switch 82. Diode 80 and switch 82 electrically isolate circuit components to the left thereof in FIG. 1 from components to the right. While all illustrated embodiments include this type of indicator, other types are contemplated. When current flows through diode 80, diode 80 lights up and switch 82 senses that light causing current to flow therethrough which indicates diode 80 current.

First cathode 22 is linked to first node 12. First anode 24 is linked to first base 32 of first transistor 30 such that a negligible amount of current flows into first base 32 until the first breakdown voltage 26 is exceeded. Likewise, second cathode 42 is linked to first node 12, and second anode 44 is linked to second base 52 of second transistor 50 such that a negligible amount of current flows into the second base 52 until the second breakdown voltage 46 is exceeded. By selecting the first diode 20 to have a lower breakdown voltage 26 than the second diode 40, the value of the first breakdown voltage 26 sets the lower voltage limit 26' of the window, and the value of the second breakdown voltage 46 sets the upper voltage limit 46' of the window. Selecting the appropriate first Zener diode 20 and second Zener diode 40 depends, therefore, on the respective lower voltage limit 26' and upper voltage limit 46' required by a particular application.

By choosing a first breakdown voltage 26 which is distinct from a second breakdown voltage 46, three regions of operation are defined. In Region I, the measured voltage between the first node 12 and second node 13 does not exceed the first breakdown voltage 26 set by the first Zener diode 20 or the second breakdown voltage 46 set by the second Zener diode 40. Thus, both the first digital transistor 30 and second digital transistor 50 remain in their cutoff regions of operation, and consequently, only negligible current flows into the first collector 34 or second collector 54. With little or no current flowing through transistor 30 indicator 16 indicates that no current is sensed. Thus, during Region I operation, indicator 16 fails to generate a signal indicating that the measured voltage is outside of the voltage window.

During Region II operation the measured voltage between first node 12 and second node 13 exceeds the first breakdown voltage 26 of the first Zener diode 20, but not the second breakdown voltage 46 of the second Zener diode 40. Hence, the first transistor 30 turns on. Since the first transistor 30 is turned on (i.e., effectively behaving as a closed circuit) and the second transistor 50 remains off (i.e., effectively behaving as an open circuit), current flows from first node 12 to second node 13 through the first collector 34 of the first transistor 30 and is received by the first emitter 36. Current thus passes through current indicator 16 and indicator 16 generates a signal indicating that the measured voltage is within the voltage window, exceeding the lower voltage limit 26' of the window but not the upper voltage limit 46'.

During Region III operation the measured voltage between first node 12 and second node 13 exceeds the first breakdown voltage 26 of first Zener diode 20 and the second breakdown voltage 46 of second Zener diode 40. Thus, both the first transistor 30 and the second transistor 50 are turned on, thereby potentially facilitating current flow. However, due to internal resistance of current indicator 16, essentially all available current flows from first node 12 to second node 13 through the second collector 54 where it is received by the second emitter 56. Since current flows through the path of least resistance, no current flows through first transistor 30 or current indicator 16 and, consequently, indicator 16 fails to generate a signal. Absence of a signal indicates that the measured voltage is outside of the voltage window.

The above embodiment assumes that indicator 16 is characterized by some resistance such that, when both transistors 30 and 50 are on, the indicator resistance blocks current flow and all current passes through transistor 50. This may not always be the case. For example, where indicator 16 causes no resistance (e.g., a Hall effect sensor), current may pass through each transistor 30 and 50 when both transistors are on, effectively causing current division. In this case the above described embodiment may still operate properly if indicator 16 is chosen only to indicate a current which is greater than the current which flows through transistor 30 when both transistors 30 and 50 are on. Thus, indicator 16 would have a current threshold which would have to be exceeded prior to indicating current.

Although the above-described embodiment linked the current indicator 16 between the first collector 34 and the first node 12, the circuit functions identically if, in an alternative embodiment, the first collector 34 is linked to the first node 12 and the current indicator is linked between the first emitter 36 and the second node 13.

Figure 2:
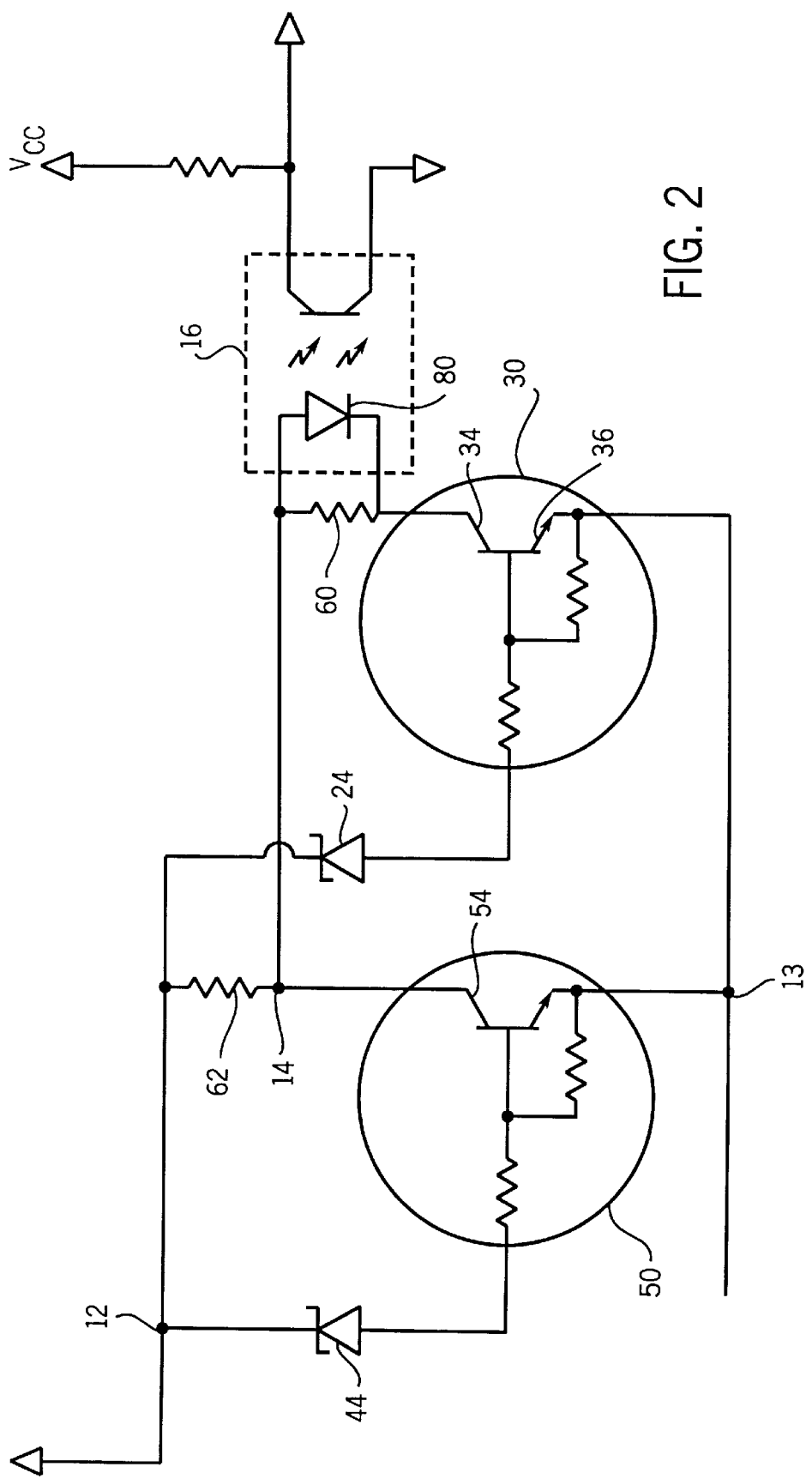
FIG. 2 is a second schematic circuit diagram in accordance with a second embodiment of the present invention.

Referring now to FIG. 2, a second embodiment of the invention is illustrated which links a first resistor 60 in series with first transistor 30. Resistor 60 can be linked in series with the first transistor 30 by either linking the first resistor 60 between the first emitter 36 and the second node 13, or between first collector 34 and first node 12. In either case diode 80 may be placed in series or in parallel with resister 60. In any of the embodiments including resistor 60, resistor 60 provides additional resistance in series with transistor 30 to block current when each of transistors 30 and 50 are both potentially conducting (i.e., on). Operation of the configuration in FIG. 2 is essentially identical to operation of the FIG. 1 configuration and therefore is not again explained here in detail.

Referring still to FIG. 2, most preferably a second resistor 62 is linked between node 12 and the second transistor collector 54 such that a third or voltage dividing node 14 is found therebetween. In this case the series arrangement of resistor 60/indicator 16 and transistor 30 is linked between nodes 14 and 13. Operation with second resistor 62 is similar to the operation described above. In either case, with current indicator 16 linked in parallel with first resistor 60, indicator 16 detects voltages across first resistor 60 when current passes therethrough.

The spirit of the present invention is not limited to any embodiment described above. Rather, the details and features of an exemplary embodiment were disclosed as required. Without departing from the scope of this invention, other modifications will therefore be apparent to those skilled in the art. Thus, it must be understood that the detailed description of the invention and drawings were intended as illustrative only, and not by way of limitation.

For example, referring again to FIG. 1, while the invention is described as including digital resistors 30 and 50, other switching configuration may be used such as transistor and resistor arrangements. For instance, transistors 30 and 50 in FIG. 1 may be replaced by first and second transistors with first and second base-to-emitter resistors and first and second series resistors in series with the bases. In this embodiment the first and second series resistors may be positioned between an adjacent Zener diode and a corresponding base or, in the alternative, may be positioned in series with the base and a Zener diode between the Zener diode and node 12.

Figure 3:
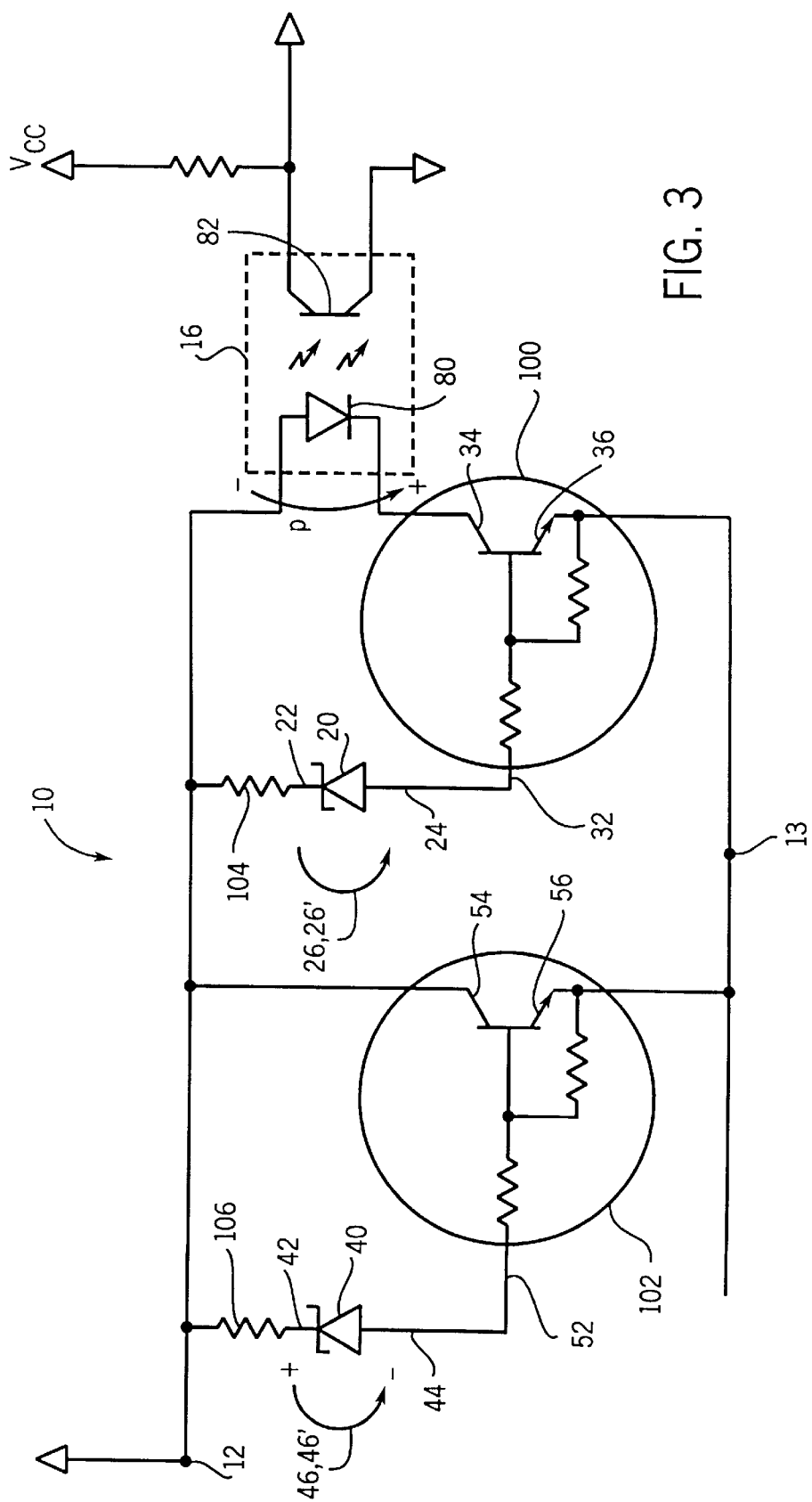
FIG. 3 is a third schematic circuit diagram in accordance with a third embodiment of the present invention.

Moreover, a less accurate although still advantageous embodiment is illustrated in FIG. 3. In FIG. 3 most of the components are similar to the components in FIG. 1 and therefore are not described again in detail. The FIG. 3 embodiment is unique in that base-to-emitter resistors are not linked to transistors 100, 102. In addition, resistors 104 and 106 are in series with respective Zener diodes and transistor bases and between node 12 and respective Zener diodes. In the alternative, resistors 104 and 106 could be placed between Zener diodes and transistor bases. Operation of the FIG. 3 embodiment is essentially the same as operation of the FIG. 1 embodiment. Features of FIG. 3 and FIG. 2 could be combined to construct additional contemplated embodiments.

To apprise the public of the scope of this invention, the following claims are made:

What is claimed is:

1. An apparatus for indicating a voltage across first and second nodes which is within upper and lower voltage limits, the apparatus comprising:

first and second Zener diodes having first and second cathodes, first and second anodes and characterized by first and second breakdown voltages, respectively, the first and second breakdown voltages being essentially the lower and upper voltage limits, respectively;

a first transistor including a first base, a first collector, and a first emitter;

a second transistor including a second base, a second collector, and a second emitter; and a first series resistor and a second series resistor;

a current indicator;

wherein the first and second series resistors are in series withthe first and second Zener diodes between the first node and the first and second bases, respectively, the Zener diodes are arranged such that upon breakdown, current flows from the first node to respective bases, the second collector and second emitter are linked to the first and second nodes, respectively, and the indicator is linked in series with the first transistor between the first and second nodes such that when the first transistor conducts, current passes from the first to the second node; and wherein, when a current passes through the indicator, the indicator indicates a voltage within the limits.

2. The apparatus of claim 1 wherein the indicator is linked between the first collector and the first node and the first emitter is linked to the second node.

3. The apparatus of claim 2 further including a resistor which is in series with the first transistor between the first and second nodes.

4. The apparatus of claim 3 wherein the indicator is in parallel with the resistor.

5. The apparatus of claim 4 wherein the resistor is linked between the first collector and the first node.

6. The apparatus of claim 5 wherein the indicator is a means for passing information to other circuitry of unlike potential.

7. The apparatus of claim 6 wherein the indicator comprises magnetically-coupled circuitry.

8. The apparatus of claim 6 wherein the indicator comprises opto-coupled circuitry.

9. The apparatus of claim 8 wherein the indicator is a diode.

10. The apparatus of claim 5 wherein the resistor is a first resistor and the apparatus further includes a second resistor linked between the second collector and the first node, a node between the second collector and the first resistor being a voltage dividing node and wherein the first resistor is linked between the dividing node and the first collector.

11. The apparatus of claim 10 wherein the second resistor has a resistance which is greater than the resistance of the first resistor.

12. The apparatus of claim 1 wherein the first and second series resistors are linked between the first node and the first and second Zener diodes, respectively.

13. The apparatus of claim 12 further including first and second base-to-emitter resistors, the first base-to-emitter resistor linked between the first base and the first emitter and the second base-to-emitter resistor linked between the second base and the second emitter.

14. The apparatus of claim 1 wherein the first and second series resistors are linked between the first and second Zener diodes and the first and second bases, respectively.

15. The apparatus of claim 14 further including a first base-to-emitter resistor linked between the first base and the first emitter and including a second base-to-emitter resistor linked between the second base and the second emitter.

16. The apparatus of claim 15 wherein the first transistor, series resistor and base-to-emitter resistor comprise a first digital transistor and the second transistor, series resistor and base-to-emitter resistor comprise a second digital transistor.

17. An apparatus for indicating a voltage across first and second nodes which is within upper and lower voltage limits, the apparatus comprising:

first and second Zener diodes having first and second cathodes, first and second anodes and characterized by first and second breakdown voltages, respectively, the first and second breakdown voltages being essentially the lower and upper limits, respectively;

a first digital transistor including a first base, a first collector, and a first emitter;

a second digital transistor including a second base, a second collector, and a second emitter;

first and second resistors; and a current indicator;

wherein the cathodes are linked to the first node, the first and second anodes are linked to the first and second bases, respectively, the first and second emitters are linked to the second node, the second resistor is linked between the first node and the second collector, the second resistor and second collector linked at a divider node, the first resistor is linked between the first collector and the divider node and the indicator is linked across the first resistor; and wherein, when a current passes through the indicator, the indicator indicates a voltage within the limits.

* * * * *